United States Patent
Sykes et al.

(10) Patent No.: US 9,398,722 B1
(45) Date of Patent: Jul. 19, 2016

(54) COLD PLATE WITH INSERTABLE INTEGRATED THERMOSTATIC EXPANSION DEVICE AND SENSING ELEMENT

(71) Applicant: Mainstream Engineering Corporation, Rockledge, FL (US)

(72) Inventors: David M. Sykes, Melbourne, FL (US); Joshua C. Dominico, Viera, FL (US); Robert P. Scaringe, Rockledge, FL (US); Gregory S. Cole, Melbourne, FL (US); Daniel A. Staples, Orlando, FL (US)

(73) Assignee: MAINSTREAM ENGINEERING CORPORATION, Rockledge, FL (US)

( * ) Notice: Subject to any disclaimer, the term of this patent is extended or adjusted under 35 U.S.C. 154(b) by 275 days.

(21) Appl. No.: 14/016,753

(22) Filed: Sep. 3, 2013

(51) Int. Cl.
*F25B 1/00* (2006.01)
*F25B 29/00* (2006.01)
*H05K 7/20* (2006.01)

(52) U.S. Cl.
CPC .................................. *H05K 7/20254* (2013.01)

(58) Field of Classification Search
CPC ................................................. H05K 7/20254
USPC .................................. 62/115; 236/92 R, 92 B
See application file for complete search history.

(56) References Cited

U.S. PATENT DOCUMENTS

| | | | | |
|---|---|---|---|---|
| 2,116,802 A | * | 5/1938 | Shivers | F25B 41/062 236/92 B |
| 2,199,498 A | * | 5/1940 | Kaufman | F25B 41/062 236/92 B |
| RE23,706 E | | 9/1953 | Lange et al. | |
| 4,114,397 A | * | 9/1978 | Takahashi | B60H 1/00485 62/516 |
| 4,149,390 A | * | 4/1979 | Iijima | F25B 39/02 62/524 |
| 4,589,265 A | * | 5/1986 | Nozawa | F25B 39/024 62/526 |
| 4,712,384 A | | 12/1987 | Crowe | |
| 4,750,334 A | | 6/1988 | Leimbach | |
| 4,809,518 A | * | 3/1989 | Murayama | F25B 39/022 62/225 |
| 5,297,728 A | | 3/1994 | Yano et al. | |
| 5,592,822 A | * | 1/1997 | Stubbs | F25B 9/02 62/51.2 |
| 5,595,065 A | * | 1/1997 | Boiarski | F17C 3/085 236/92 B |
| 5,715,705 A | * | 2/1998 | Kujirai | B60H 1/00485 62/525 |
| 8,312,736 B2 | | 11/2012 | Yang et al. | |
| 2010/0328892 A1 | * | 12/2010 | Madison, Jr. | F28D 15/00 361/702 |

* cited by examiner

*Primary Examiner* — Ljiljana Ciric (57) ABSTRACT

An apparatus for uniform cooling of a single power electronics device, an array of discrete power electronics devices or types of other heat-generating by integrating discrete thermostatic expansion devices (TXVs) and their control directly into each discrete cold plate. The thermostatic expansion device is positioned such that a sensing element is located directly within the exit refrigerant stream.

10 Claims, 10 Drawing Sheets

Alternative embodiment of the Current Invention of Integrating the TXV and Sensing Bulb within Each of a Plurality of Evaporative Cold Plates with a recuperative heat exchanger Figure 1: Prior Art: Conventional Implementation of a Single TXV with a distributor and Recuperative Heat Exchanger to Cool and Control a Plurality Evaporative Cold Plate Figure 2: Prior Art: Conventional Implementation of a Dedicated TXV and Recuperative Heat Exchanger to Cool and Control a Each Evaporative Cold Plate Figure 3: Current Invention of Integrating the TXV and Sensing Bulb within Each of a Plurality of Evaporative Cold Plates Figure 4: Alternative embodiment of the Current Invention of Integrating the TXV and Sensing Bulb within Each of a Plurality of Evaporative Cold Plates with a recuperative heat exchanger Figure 5: Isometric View of TXV Cartridge Figure 6: Section A-A View of the TXV Cartridge Figure 7: Section B-B View of the TXV Cartridge Figure 8: Sectional view of an integrated TXV cartridge where the bellows is both the sensing element and the actuator.

Figure 9: Section View of an Integrated TXV Installed in a Representative Cold Plate Figure 10: PRIOR ART: Section View of a conventional balanced TXV (U.S. Patent 4,750,334 to Leimbach)

Figure 11: PRIOR ART: Integrated TXV into an air-cooled evaporator (U.S. Patent 4,712,384 to Crowe)

Figure 12: PRIOR ART: Section View of a TXV with internal sensing bulb (U.S. Patent 5,297,728 to Yano)

COLD PLATE WITH INSERTABLE INTEGRATED THERMOSTATIC EXPANSION DEVICE AND SENSING ELEMENT

BACKGROUND AND SUMMARY OF THE INVENTION

The present invention relates to a method and apparatus for ensuring adequate and uniform cooling for a single heat-generating device or an array of discrete heat-generating devices.

Heat fluxes and temperature uniformity constraints for modern electronics and optics are progressively demanding. As this occurs, the cooling technology for these components shifts from low-cost legacy solutions like air cooling and liquid cooling that produce heat transfer coefficients of 100 s to 1000 s of $W/m^2K$ to advanced thermal management solutions, such as vapor-compression cooling that can supply heat transfer coefficients up to 100,000 $W/m^2K$.

Vapor compression technology has a limitation, however, when applying it to an arrayed heat load with many discrete sources. Supplying cooling to discrete sources (or circuits in an evaporator) has been historically accomplished via distributors located immediately downstream of the expansion device. These devices impose a high fluid velocity (which translates to a considerable pressure loss) through discrete orifices within the device. Each discrete orifice is dedicated to each discrete heat load. The momentum-driven separation will give near uniform flow distribution between the conduits at the cost of pressure loss. As the heat rejection temperature approaches the cooling temperature, the high-side pressure and low-side pressure of the system also converge, therefore making less pressure drop available to be used for flow balancing and further limiting the flow control of the pressure-drop balancing approach. Additionally, as the number of discrete cold plates (heat loads) increases; the size, weight, and complexity of the plumbing necessary to balance the two-phase flow-mixture downstream of the expansion device (and upstream of the cold plates) increases dramatically. Without the refrigerant flow uniformity to the individual cold plates, the temperature uniformity on and between cold plates will degrade rapidly, causing component failure in some cases.

We have discovered, however, an improved way to control the temperature uniformity of discrete heat loads using a vapor compression cooling scheme by integrating individual compact thermostatic expansion devices (TXVs) and their control directly into each individual cold plate. Individual control of each cold plate simplifies the overall system because the cold plates can all be maintained at a uniform temperature, regardless of the heat load to each individual cold plate, simply by maintaining a uniform outlet pressure of the superheated refrigerant exiting the cold plates, and ensuring that the cold plates are all supplied with sub-cooled liquid refrigerant at each cold plate inlet. By way of the present invention, the action of the integral TXV (of the cold plate) via opening or closing an internal orifice controls the flow to each cold plate. Thus, the control of each cold plate is localized, greatly reducing the overall control complexity. In addition, the inlet and outlet headers to the arrays of cold plates are simplified because the inlet headers have only subcooled liquid and outlet headers have only superheated vapor. This approach avoids individual two-phase distributor lines that must be balanced and fed to each cold plate.

In addition to saving space, plumbing complexity, and control complexity for the overall system, integrating the TXV within the cold plate also provides much faster TXV response time. Integrating the TXV into the cold plate also allows the sensing element to be integrated into the TXV. Integrating the sensing element with the TXV eliminates the capillary tube used in conventional TXV systems and improves the time response of the TXV because the sensing element can be immersed in the exiting refrigerant stream instead of relying on conduction of the outlet tube. Finally, with the integrated TXV configured as a cartridge, sealing can be accomplished via O-rings or other mechanical seals, thereby enabling field replacement of individual TXVs without the need of brazing or soldering, as is required for some conventional TXVs. Because of its enhanced temperature control, ability to be field replaceable, and augmented response time, the present invention enables the use of advanced power electronics, and more specifically, high-power lasers that demand temperature uniformity on the order of ±2° C. and full load "turn-on" times of less than 400 milliseconds.

Figure 10:
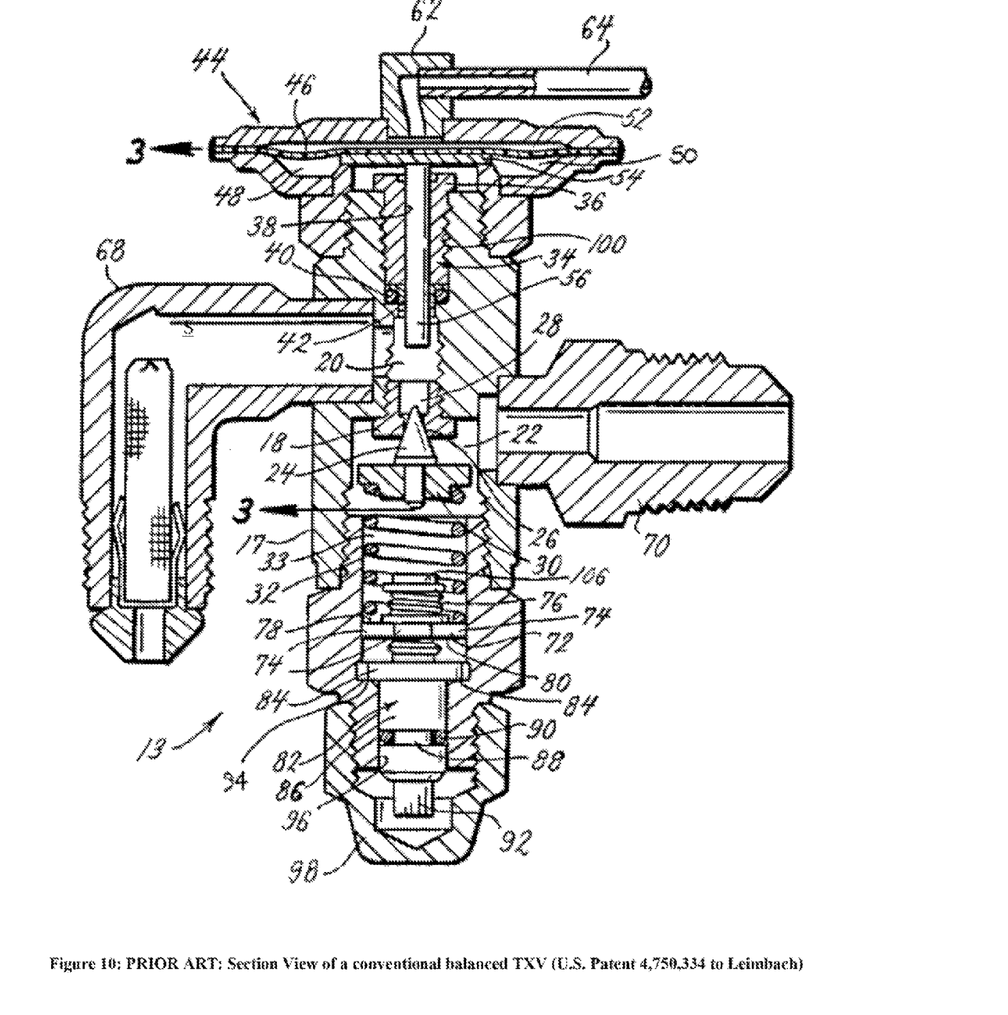

As is well known in the art, the conventional TXV approach, as disclosed, in U.S. Pat. No. 4,750,334 whose FIG. 2 is repeated here as FIG. 10, uses an external sensing bulb tilled with a temperature sensitive working fluid that is mechanically attached to the outlet of the evaporator. Temperature changes at the outlet of the evaporator are converted to changes in working fluid pressure within the external sensing bulb. The pressure within the external sensing bulb is communicated through a capillary tube 64 to a diaphragm which works against a resistive force to open the valve. This is also discussed in U.S. Pat. No. RE23,706 where an "equalizer passage" (col 3, lines 36-45) communicates the pressure at the inlet of the evaporator to the underside of the follower 22, and of the opposite side of the pressure created by the sensing bulb 10.

Figure 11:
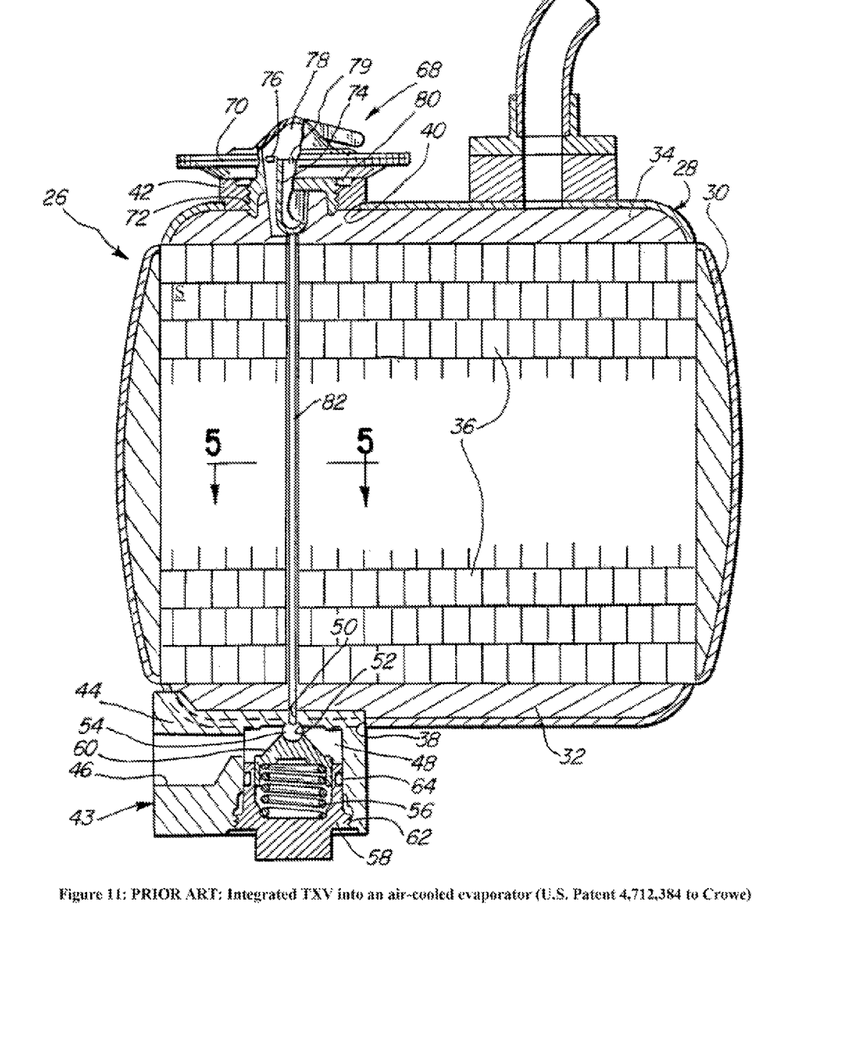

U.S. Pat. No. 4,712,384 sought to integrate the TXV into the evaporator and thereby improve the conventional approach by integrating the sensing bulb and diaphragm into the outlet stream of the evaporator. However, that approach used an external mechanical "push rod" 82 to actuate the valve portion of the TXV, which was located in the inlet stream of the evaporator as seen in FIG. 4 and shown in the present application as FIG. 11. We have discovered a far better approach, which is more compact, simpler, and does not require the use of an external push rod to activate the opening of the orifice of the TXV. A further concern with the external push rod approach is that, as temperatures change, the TXV valve opening is altered by the thermal expansion of this relatively long push rod. Since an air-to-refrigerant evaporator can tolerate both an imprecise superheat control and a large variation in surface temperature, this may not be a serious thermal performance drawback, but it is certainly expensive to manufacture and maintain. For advanced cold plate thermal control, as envisioned by the inventors named in this application, and as stated previously, a precise thermal control, namely temperature uniformity on the order of ±2° C. and full load "turn-on" times of less than 400 ms, are required. The conventional approach described in U.S. Pat. No. 4,712,384 does not have this capability.

Figure 12:
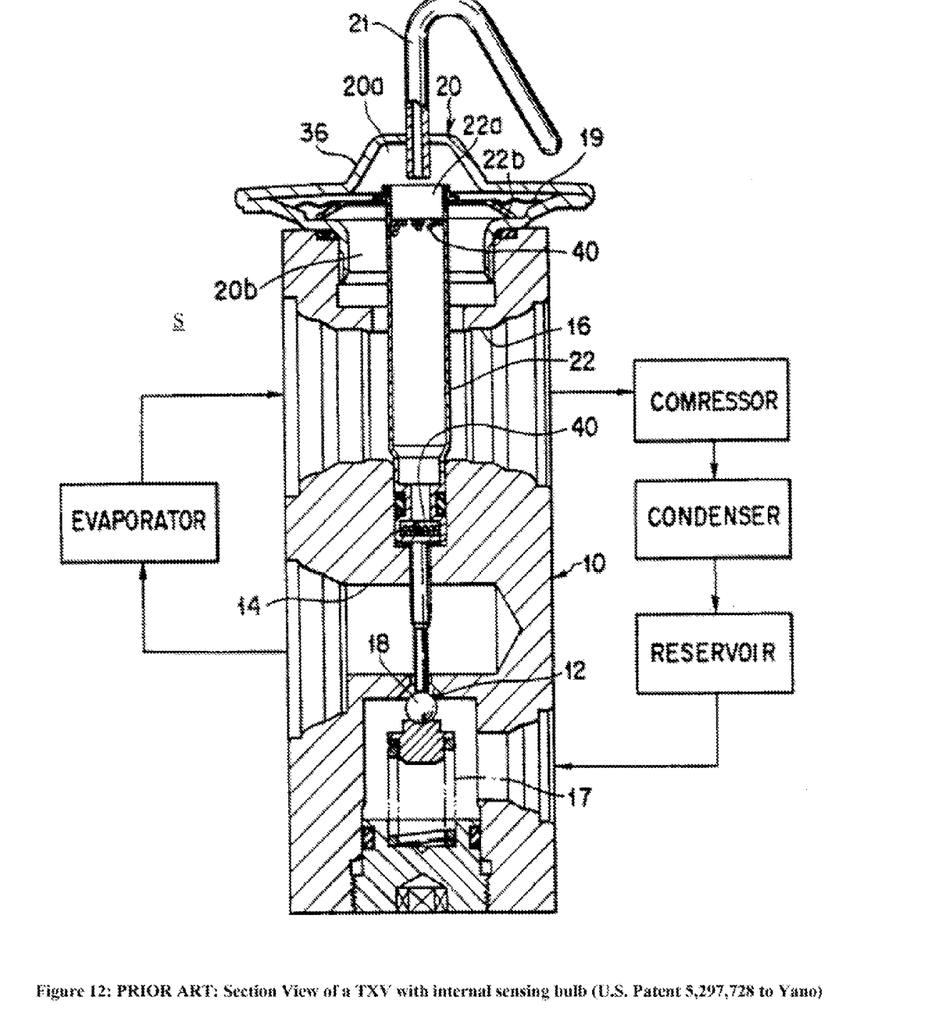

U.S. Pat. No. 5,297,728 discloses another attempt to eliminate the sensing bulb of the TXV and whose FIG. 1 is reproduced herein as FIG. 12. This prior art proposed an external TXV, which differs from a TXV integrated into the cold plate of the evaporator as described in this application. Rather than utilizing a sensing bulb mounted to the exterior of the outlet tubing, said patent proposed passing the outlet refrigerant through an added passage in the TXV and incorporating the temperature-activated force to open and close the valve within this added passage. While, as noted above, the prior art had also proposed a "push rod" to transmit this force. U.S.

Pat. No. 5,297,728 used a valve body member 22 with an absorbent gas mixture to provide a "heat ballast" (col 4, lines 56-64). The present invention does not, however, require any complex mechanism to dampen the TXV response and avoid overshoot, or undershoot since the thermal inertia of the exiting superheated refrigerant and the surrounding metal of the cold-plate are utilized to provide the thermal ballast.

An object of the present invention is to provide a cartridge TXV that fundamentally differs in the method of temperature and refrigerant flow control that has been used in the past. First, the sensing element is integral to the TXV but is located external to and at the end of the TXV instead of within the TXV. Second, the integrated TXV is inserted into the evaporator outlet flow path. These two key differences eliminate two fluid connections and temperature variations experienced within the sensing bulb of U.S. Pat. No. 5,297,728. Third, having the sensing element immersed in the outlet stream of the evaporator and integral to the TXV enhances control because it eliminates the conduction resistance seen in conventional TXV arrangements.

An additional object of the present invention is to provide a method for improving and localizing the control of evaporative cold plates, while reducing the complexity of the remainder of the vapor compression system. The present invention goes beyond previous efforts to integrate TXVs into cold plates for vapor compression systems. U.S. Pat. No. 8,312,736 discloses an integrated TXV in a reverse-flow double pipe configuration. In this known configuration partially expanded refrigerant maintained above the ambient dew point flows through the outer pipe and then through an expansion device. Once through the expansion device, the cold refrigerant accepts heat from an electronics load and flows out through the inner pipe. This design seeks to eliminate condensation from sub dew-point cooling of electronics. The major drawback to this approach, however, is that the expansion is performed via fixed orifice (capillary tube) incapable of controlling the cooling temperature or the superheat into the compressor. Therefore, precise temperature control of sensitive electronics with varying ambient conditions and thermal loads cannot be performed with this device. Taking a different approach, the present invention integrates a cartridge TXV into a cold plate to provide active temperature control of sensitive electronics and eliminate the drawbacks of previous attempts.

BRIEF DESCRIPTION OF THE DRAWINGS

These and further objects, features and advantages of the present invention will be seen by the following detailed description of a currently preferred, non-limiting embodiment of the present invention shown in the accompanying drawings wherein:

FIG. 10 reproduces FIG. 2 of U.S. Pat. No. 4,750,334.

FIG. 11 reproduces FIG. 4 of U.S. Pat. No. 4,712,384.

FIG. 12 reproduces FIG. 1 of U.S. Pat. No. 5,297,728.

DETAILED DESCRIPTION OF THE DRAWINGS

Figure 1:
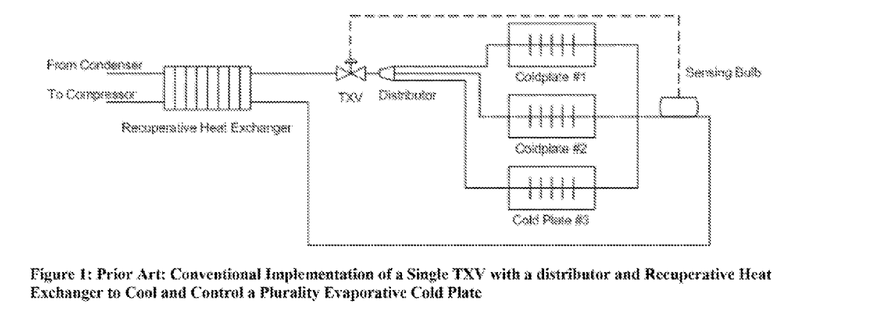
FIG. 1 is a schematic showing conventional implementation of a single TXV with a distributor and recuperative heat exchanger to cool and control a plurality evaporative cold plate.
Figure 2:
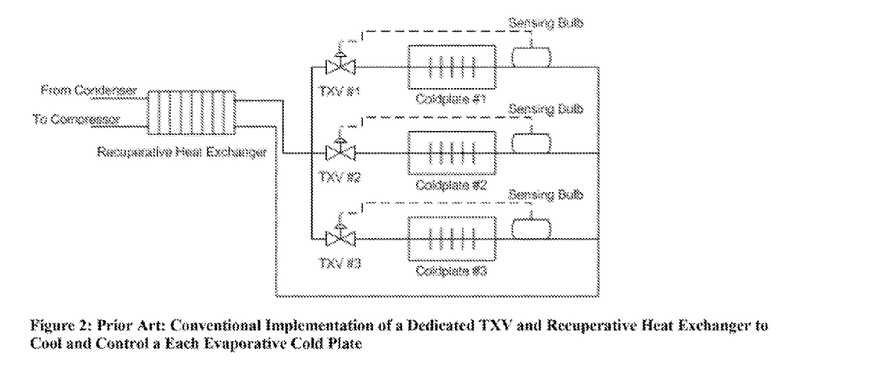
FIG. 2 is a schematic showing conventional implementation of dedicated TXVs to cool and control each evaporative cold plate.

The conventional vapor compression cooling system has either a single external TXV that feeds a plurality of cold plates #1-3 via a distributor (shown in FIG. 1) or a plurality of individual TXVs ##1-3 that are dedicated to each cold plate ##1-3, respectively (shown in FIG. 2). In both cases, conventional TXVs are used to control the superheat leaving the evaporative cold plate with an external sensing bulb or bulbs externally clamped onto the discharge tube of the evaporators. The external sensing bulb is in fluidic communication with the valve via capillary tube in a known manner. An integrated TXV according to the present invention as hereinafter described, however, has the advantage that it improves and localizes the thermal control of electronics cold plates and eliminates balanced distributor conduits.

Figure 3:
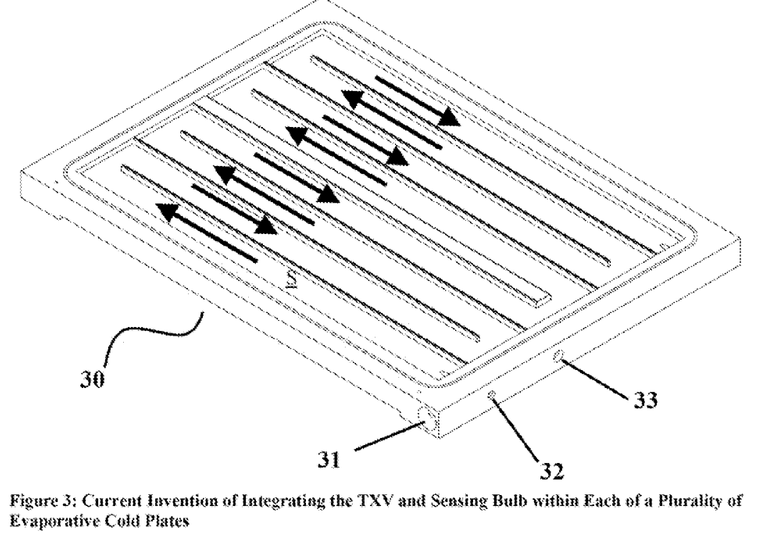
FIG. 3 is a schematic showing in perspective view one currently contemplated embodiment of the present invention in which the TXV and sensing bulb are integrated within each of a plurality of evaporative cold plates, only one of which is shown with its lid removed to illustrate the interior of the cold plate.

In the present invention, the TXV is integrated directly into the cold plate and positioned so the outlet temperature sensing portion is located directly within the exit refrigerant stream, thereby improving the time-response of the valve, eliminating the need for heat ballasts and capillary tubes. More specifically, FIG. 3 shows an isometric view of a representative cold plate (30) with the lid removed revealing the integrated TXV. The integrated TXV in the currently preferred embodiment hereinafter described is constructed as a cartridge that is inserted into a port (31) located the end of the cold plate. (30) With this arrangement, subcooled liquid from the system (from components such as the condenser, recuperative heat exchanger, etc.) is fed in a known manner to the inlet port (32). The refrigerant is expanded by the integrated TXV and flows through the cold plate, providing cooling to electronics or any heat-generating components. It is important to note that even though the cold plate is shown with serpentine passages (S) as shown by the arrows, different configurations, including parallel passages, a combination of series and parallel circuits, interrupted channels, or the like are contemplated without departing from the present invention. Once the refrigerant has absorbed heat through the passages S, it passes through an outlet plenum (e.g., (91) in FIG. 9 discussed below) over the sensing portion ((52) in FIG. 5 discussed below) of the integrated TXV, and exits the cold plate (30) through an outlet port (33). Just as in a conventional TXV, the outlet refrigerant superheat controls the actuation of the TVX in the present invention. However, with the present invention, the direct immersion of the outlet temperature sensing device enhances control by eliminating temperature drops across the thermal interfaces, such as the sensing bulb, tubing wall and the like. Additionally, the present invention reduces the thermal response time when compared to conventional TXV approaches because of the direct contact of the refrigerant with the TXV outlet temperature sensing device. This response time can also be adjusted by tuning the relative mass of cold plate material and refrigerant in the region of the TXV outlet temperature sensing device. The increased heat capacity of the cold plate material, relative to the heat capacity of the superheated refrigerant, provides a thermal ballast, and allows for the selection of the desired response time by adjusting the relative ratio of cold plate material and superheat refrigerant in the region surrounding the TXV temperature sensing element.

Integrating a single TXV or multiple TXVs into the cold plate places the largest pressure drop of the system at the point of use. Thus, flow mal-distribution amongst multiple cold plates or multiple passages within a cold plate is eliminated by way of the present invention. Additionally, local refrigerant flow metering results in a high degree of thermal control for massively arrayed and distributed systems. Finally, the inlet and outlet plumbing to the cold plate are both single phase. Thus, gravitational effects related to flow separation or density dependent flow variations from curved plumbing or flow splitting are all eliminated from the inlet and outlet ports and associated manifolds.

Figure 4:
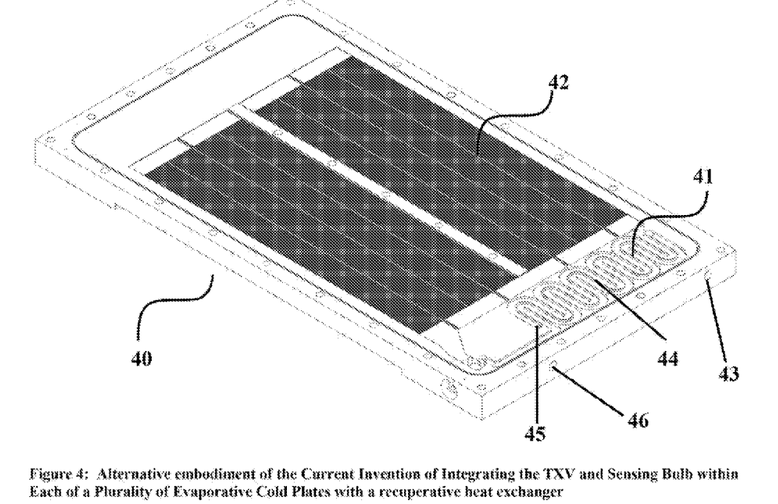
FIG. 4 is a perspective view of an alternative embodiment of the present invention with a recuperative heat exchanger.

In some applications, including high-heat-flux electronics cooling, where the heat load must be cooled with low-vapor-quality refrigerant (to establish the desired heat transfer regime) and the temperature must remain uniform across a large surface area, the cold plate exit quality could be less than 1.0 (meaning the exit flow is a two phase mixture and not a superheated vapor). If this is the case, a recuperative heat exchanger can be used to completely vaporize the fluid exiting the cold plate before it reaches the integrated TXV sensing bulb. In addition to providing the superheat necessary to control the activation of the TXV, this approach also serves to protect the vapor compression system by preventing liquid refrigerant (in the two phase mixture) from returning to the compressor, which can cause damage to bearings, valves, and connecting rods. Also, it ensures that only liquid refrigerant enters the TXV, thereby stabilizing the flow across the valve. FIG. 4, shows such an integrated cold plate with TXV and recuperative heat exchanger (41) as part of the unitary cold plate housing (40). This heat exchanger (41) comprises additional lengths of fluid passages formed or machined into the cold plate housing (40) in the same manner as the evaporative cooling channels (42) were formed or machined. Again, the design of the recuperative heat exchanger passages can be arranged in parallel flow, series flow or a combination of either configuration on either the inlet or outlet sides of the integrated recuperative heat exchanger. Likewise the flow path can be either a co-current or counter-current flow configuration as is well known in the art for the design of recuperative heat exchangers. Subcooled or very-low-quality saturated refrigerant from the condenser (not shown for ease of understanding) enters the recuperative heat exchanger (41) at a high pressure through the cold plate inlet (43). Rather than proceeding directly to the TXV, however, the fluid meanders through a channel placed directly adjacent to but separated by wall (44) from another channel containing a superheated or saturated refrigerant at a low pressure exiting from the cold plate cooling channels (42). This superheated or saturated refrigerant is at a lower pressure and therefore a lower temperature relative to the subcooled refrigerant from the condenser because passing through the TXV integrated into the cold plate causes a substantial pressure drop, which leads to a lower saturation temperature. The wall (44) separating the two fluids allows heat to transfer readily from the warmer inlet subcooled refrigerant (further increasing the subcooling) to the superheated or high-quality saturated refrigerant, thereby increasing the superheat of the exit refrigerant stream. The effect of the recuperative heat exchanger is therefore to increase subcooling upstream of the TXV inlet and increase superheating downstream of the temperature controlled portion of the cold plate but upstream of the TXV outlet sensing element. This superheated refrigerant which exits the recuperative section of the cold plate then flows through a transfer passage (45) to the sensing portion of the TXV and exits the cold plate through the outlet (46). This embodiment allows the coolant to remain two-phase under the area of interest of the cold plate (the temperature controlled portion of the cold plate) ensuring extreme temperature uniformity while retaining the superheat-based temperature control of the TXV.

Functionally, this second embodiment with the integral recuperative heat exchanger shown in FIG. 4 is similar to conventional external heat exchangers used in modern air conditioning and refrigeration systems, but has the advantage of being compact and lightweight. Existing recuperative heat exchangers are commonly shell-and-tube or coaxial tube-in-tube designs which require additional brazed joints, thick walls, and consume a large volume. By contrast, the recuperative heat exchanger shown in FIG. 4 is part of the integrated TXV and is created in the cold plate body and can be made of a lightweight material, such as aluminum. Of course, this invention can be utilized with all known materials of cold plate construction including, copper, brass, bronze, steel, stainless steel, nickel, carbon composites, ceramics and the like.

Figure 5:
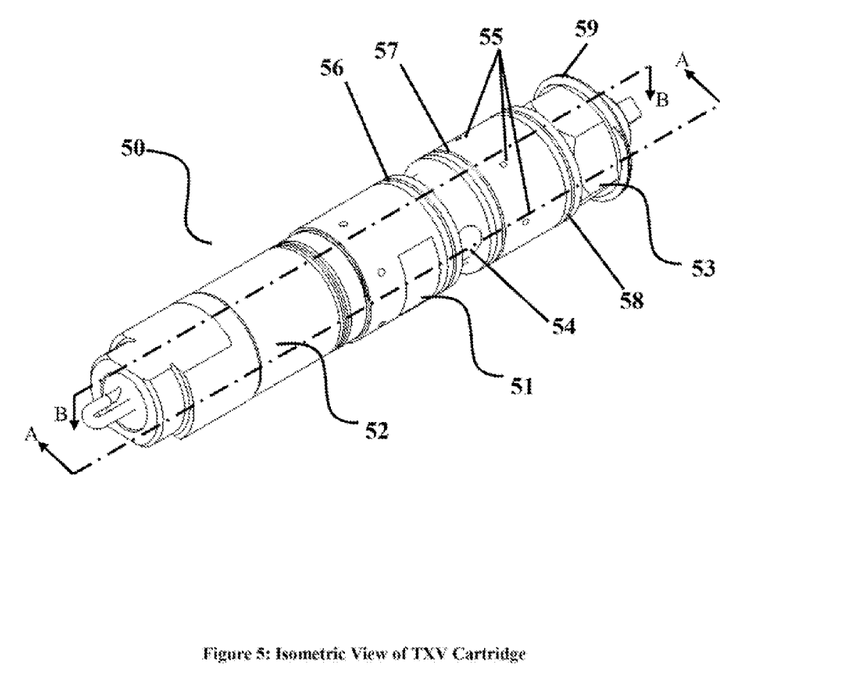
FIG. 5 is an isometric view of the integrated TXV cartridge.

FIG. 5 shows an isometric view of the preferred embodiment of the integrated TXV cartridge (50) that would be inserted into the blind hole (31) in FIG. 3. The integrated TXV cartridge has three sections; namely, the main body (51) that houses the orifice and needle, the temperature sensing portion (52), and the superheat adjustment portion (53). The main body (51) has an inlet port (54) that is fed with the subcooled refrigerant from the system (such as a condenser for example). The pressure of the subcooled refrigerant is dropped by flowing the refrigerant through the viable flow area created by the relative location of the needle ((61) in FIG. 6) and the orifice ((67) in FIG. 6). This drop in refrigerant pressure causes the refrigerant to flash into a two-phase refrigerant mixture before entering the isothermal temperature controlled passages of the interior of the cold plate. Multiple discharge ports (55) are used in this embodiment to direct this two-phase refrigerant into the isothermal section (the temperature controlled portion) of the cold plate.

Figure 6:
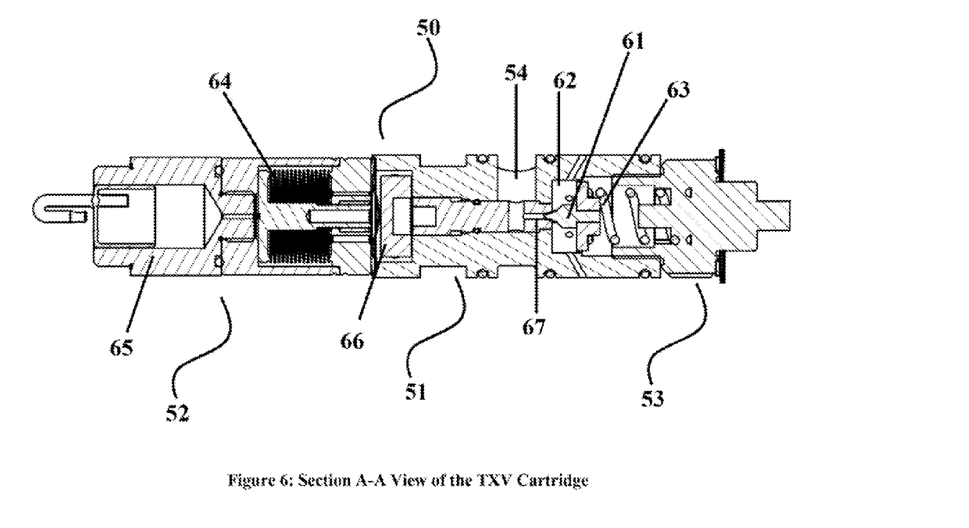
FIG. 6 is a sectional view of the integrated TXV cartridge along line A-A in FIG. 5.
Figure 7:
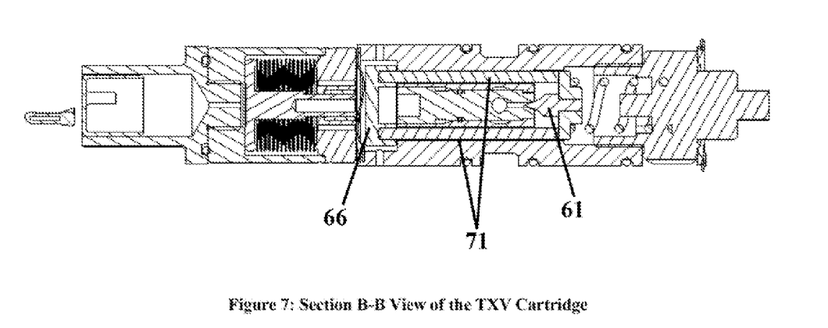
FIG. 7 is a sectional view of the integrated TXV cartridge along line B-B in FIG. 5.

The TXV cartridge is designed to be inserted directly into a blind hole in the cold plate and sealed with three conventional O-rings. As shown in FIG. 5, the first (56) and second (57) O-rings seal the inlet pressure from the cold plate (outlet) pressure. The third O-ring (58) seals the TXV cartridge main body (51) from the ambient to create a sealed cold plate (30) of FIG. 3 or (40) of FIG. 4. Adjacent to the superheat adjustment section, a mechanical device (59) (FIG. 5) such as an internal C-clip is employed to secure the integrated TXV cartridge into the cold plate FIGS. 6 shows the A-A section of the TXV cartridge illustrated in FIG. 5. The motion of the needle (61) in the TXV is determined by the balance between three forces: the pressure difference between an inlet port (54) and an expanded section (62), the force of a superheat spring (63) which can be adjusted by the superheat adjustment portion (53), and the net force added by a sensing driver (64) that is located within the sensing portion (52) between the sensing element (65) and the main body (51). The sensing element is arranged so that it is immersed in the exit refrigerant flow stream when installed into the integrated cold plate (30) or (40). The superheated refrigerant transfers heat to the sensing element (65) which in turn causes a pressure change to the fluid within the sensing element (65). The fluid within the sensing element (65) may be a single phase fluid, a two-phase refrigerant, including but not limited to the refrigerant in the cooling system or may be any number of fluids commonly used in commercial TXVs and well known in the art. This pressure is communicated to the sensing driver (64) which converts the pressure to a force that is transmitted through a pressure plate (66), push rods ((71) in FIG. 7 discussed below), and ultimately, the orifice needle (61). Of course as is well know in the art, the bellows-type actuator can be replaced with any hermetic linear actuator (e.g. diaphragms, rolling diaphragms, etc.) without departing from the present invention FIG. 7 shows another section (section B-B of FIG. 5) of the TXV cartridge which illustrates the orientation of the push rods (71) and pressure plate (66) that mechanically transmits the force generated by the sensing driver (64) to the orifice needle (61).

Figure 8:
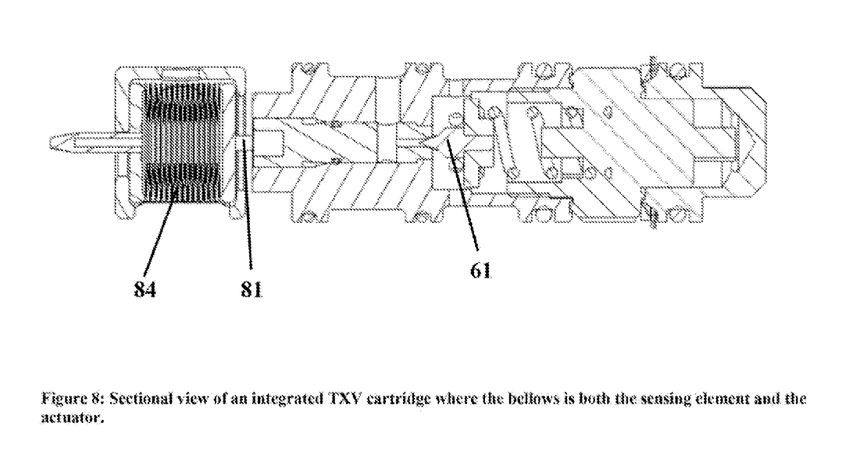
FIG. 8 is an isometric view of another embodiment of the integrated TXV cartridge where the bellows is both the sensing element and the actuator.

As shown in FIG. 8, the bellows-type actuator can also serve as the sensing element for the most compact configuration and our preferred embodiment of the present invention. In this embodiment the combined bellows-type actuator and sensing element (84) is arranged so that it is immersed in the exit refrigerant flow stream when installed into the integrated cold plate (30) or (40). The superheated refrigerant transfers heat to the combined bellows-type actuator and sensing element which in turn causes a pressure change to the fluid within the combined actuator and sensing element. Once again, the fluid within may be a single phase fluid, a two-phase refrigerant, including but not limited to the refrigerant in the cooling system or may be any number of fluids commonly used in commercial TXVs and well known in the art. This pressure change inside the combined actuator and sensing element causes the bellow to expand or contract, converting this pressure change to a force that is transmitted through the push rod (81) and ultimately, the orifice needle (61).

Although the integrated TXV cartridge of the present invention operates in a manner somewhat similar to a conventional TXV because it actuates the valve based on superheat-induced pressure, there are four fundamental and significant differences between the two, namely:
  1. The sensing bulb in the present invention is immersed in the refrigerant stream leaving the cold plate. This reduces the reaction time of the TXV, removes some thermal resistances in the transfer of this energy into the sensing element, and enhances thermal control and thermal response
  2. The sealing of the TXV in the present invention is based on mechanical seals (and not external brazed connections), this approach allowing for easier maintenance and replacement of the TXV.
  3. The sensing bulb, sensing driver, and valve body of the present invention are combined into a single uni-body construction, thereby eliminating the capillary line used in conventional TXV arrangements.
  4. The push rod of the current invention is contained completely within the TXV and not exposed to external temperature variations which could lead to variations in thermal expansion and therefore to changes in valve opening position.

Figure 9:
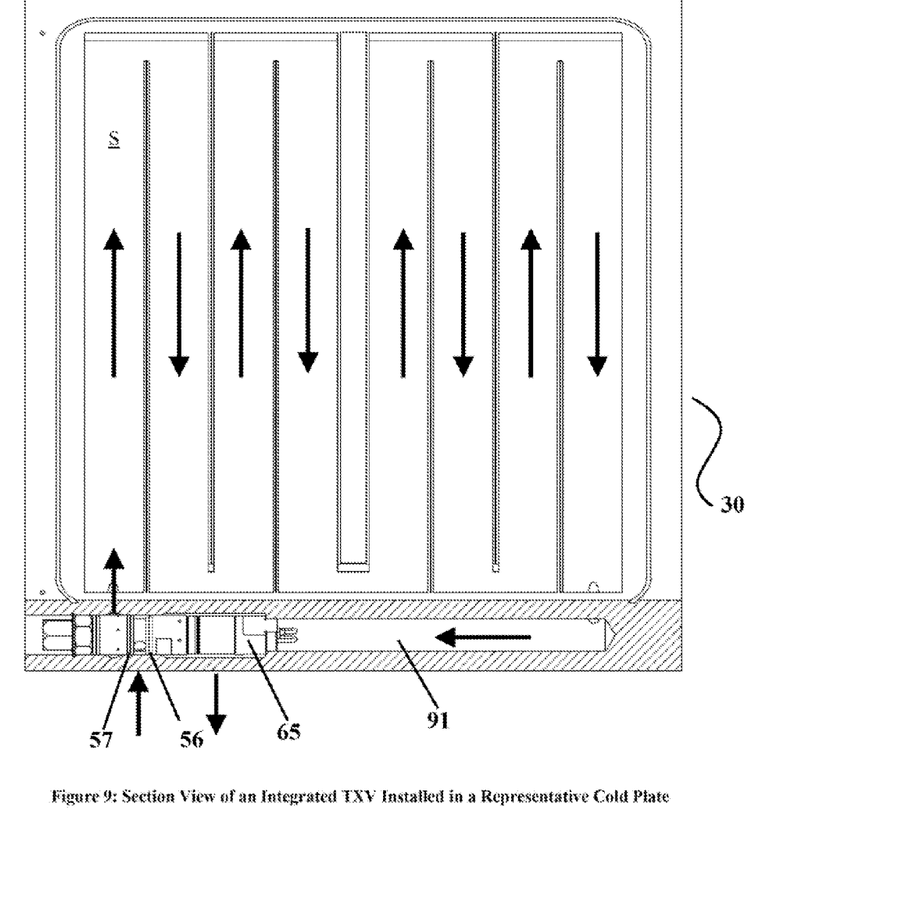
FIG. 9 is a partial sectional plan view of an integrated TXV installed in a cold plate of the type shown in FIG. 3.

FIG. 9 shows a section view of the integrated TXV cartridge installed within the cold plate (30). The subcooled inlet port is oriented such that the high pressure only acts in between the first (56) and second (57) O-rings. The remainder of the cold plate operates at approximately the pressure established within the expanded section. Refrigerant flows through the cold plate serpentine passages (S) as indicated by the arrows, providing cooling, while evaporating and slightly increasing in temperature once fully evaporated. It is important to note that even though the cold plate (30) shown in FIG. 9 is configured with serpentine passages (S) as an example only; other configurations are possible without departing from the present invention (for example parallel passages, a combination of series and parallel circuits, interrupted channels, pin fins, etc.). The heated refrigerant vapor returns to an outlet plenum (91) where it flows over the sensing element (65), changing the pressure of the fluid contained in the sensing element and thereby changing the volume of the bellows and thereby moving the needle, so as to change the relative flow area between the needle (61) and the orifice (67).

In summary, a cold plate with an integrated TXV according to the present invention provides faster time response, provides more precise thermal control, eliminates distributor problems in large arrayed systems, allows for field replacement of the TXV without brazing, and provides a more compact and higher performance solution in comparison to conventional systems.

While the currently preferred embodiments of the invention have been illustrated and described, it should be understood that, after reading this disclosure, variations to this embodiment will be apparent to one skilled in the art without departing from the principles of the invention described herein. Therefore, we do not intend to be limited to the details shown and described herein but intend to cover all such changes and modifications as are fairly encompassed by the scope of the appended claims.

We claim:

1. In a cold plate having an inlet to which a refrigerant that is sub-cooled is supplied and an outlet from which the refrigerant that is superheated exits the cold plate, between which inlet and outlet at least one passage for flowing the refrigerant internally through the cold plate is operatively arranged to cool at least one heat, generating device associated with the cold plate, the improvement comprising a thermal expansion valve and a sensing element operatively connected with the thermal expansion valve and arranged in the cold plate such the sensing element is located directly in a stream of the flowing refrigerant exiting the outlet of the cold plate so as to communicate a force created by a pressure change in the sensing element due to a temperature change in a refrigerant stream exiting the cold plate to alter a variable flow cross-sectional area of the thermal expansion valve.

2. In the cold plate of claim 1, wherein the thermal expansion valve and the sensing element constitute separate sections of a single body constituting a cartridge configured to be insertable into the cold plate.

3. In the cold plate of claim 1, wherein the cold plate is provided with a blind hole into which the thermal expansion valve and the sensing element are configured to be removably insertable.

4. In the cold plate of claim 1, wherein a recuperative heat exchanger is incorporated into the cold plate so as to completely vaporize and superheat any of the flowing refrigerant remaining in a liquid state before reaching the sensing element via the outlet of the cold plate.

5. In the cold plate of claim 4, wherein the recuperative heat exchanger is arranged in the cold plate such that the flowing refrigerant received from a condenser of a vapor compression system enters the inlet of the cold plate and is caused to meander through the cold plate so as to be adjacent to but separated from the flowing refrigerant heated by the at least one heat generating device so as to maintain the flowing refrigerant in two phases within a region of the cold plate associated with the at least one heat generating device and prevent the liquid state refrigerant from returning to a compressor of the vapor compression system.

6. In the cold plate of claim 1, wherein one of serpentine passages and parallel passages is provided between the inlet and the outlet of the cold plate.

7. In the cold plate of claim 1, wherein the thermal expansion valve comprises a main body housing an orifice arranged to receive the refrigerant that has been subcooled from one of a condenser of a vapor compression system and a recuperative heat exchanger and a needle operatively arranged adjacent a plurality of discharge ports for varying the flow-cross-sectional area and discharging the refrigerant in a two-phase state into the cold plate.

8. In the cold plate of claim 7, wherein one end of the main body has a superheat adjustment portion, and an opposite end of the main body is operatively associated with the sensing element.

9. In the cold plate of claim 7, wherein the thermal expansion valve further comprises a superheat spring and a sensing driver between the sensing element and the main body, with the needle being operatively arranged in relation to the spring and sensing driver to move based on forces created by a pressure difference between an inlet port in the main body and an expanded section of the valve, the superheat spring and the sensing driver for varying the flow cross-sectional area.

10. In the cold plate of claim 1, wherein all of the refrigerant contained in the sensing element is a two-phase fluid so as to create a change in internal pressure of the sensing element in response to temperature changes.

* * * * *